United States Patent [19]

Shirai

[11] 4,196,378
[45] Apr. 1, 1980

[54] CIRCUIT FOR DETECTING A POSITIVE PHASE OR AN OPPOSITE PHASE IN THREE PHASE ALTERNATING POWER SOURCE

[75] Inventor: Hiroshi Shirai, Hirakata, Japan

[73] Assignee: Tae-Weon, Mo, Moriguchi, Japan

[21] Appl. No.: 875,509

[22] Filed: Feb. 6, 1978

[30] Foreign Application Priority Data

Feb. 22, 1977 [JP] Japan .............................. 52/21085[U]
Jul. 2, 1977 [JP] Japan .............................. 52/13993[U]

[51] Int. Cl.$^2$ ............................................. H02P 7/18
[52] U.S. Cl. .................................... 318/438; 361/33; 361/76; 361/77
[58] Field of Search .................... 318/438; 361/33, 76, 361/77

[56] References Cited

U.S. PATENT DOCUMENTS

| | | | |
|---|---|---|---|
| 2,687,512 | 8/1954 | Miller et al. | 361/76 |
| 2,724,782 | 11/1955 | Holloway | 361/77 |
| 2,975,334 | 3/1961 | Callan | 361/77 |
| 3,395,324 | 7/1968 | Rager, Jr. | 361/77 |
| 3,428,865 | 2/1969 | Opad | 361/77 |
| 3,467,833 | 9/1969 | Sandgren | 361/76 |

*Primary Examiner*—David Smith, Jr.
*Assistant Examiner*—M. Mutter
*Attorney, Agent, or Firm*—Fisher, Christen & Sabol

[57] ABSTRACT

A circuit for detecting whether, or not, a three-phase load is correctly connected to a three-phase supply employs an inductance, capacitor and resistor connected in the three branches of the load circuit so as to generate a single phase output signal when connected to the supply, to voltage of the signal depending upon the connection to the supply. The circuit requires only three wires and not connected to a ground, or neutral. The output signal controls a reversing switch to ensure that the load is always automatically connected correctly; in a preferred form only one of the voltages is sufficient to light a source of radiant energy to activate a sensor to energize the reversing switch.

11 Claims, 7 Drawing Figures

CIRCUIT FOR DETECTING A POSITIVE PHASE OR AN OPPOSITE PHASE IN THREE PHASE ALTERNATING POWER SOURCE

This invention relates to electrical power supplies of the type wherein a three-phase alternating current is supplied to a load, such as a three-phase electric motor, and more particularly to means for detecting the phase relationships of the three conductors which supply the current and for automatically switching the connections between the supply and load if the three conductors are improperly connected, whereby the proper phase relationships will be automatically maintained.

Hitherto it has been proposed to detect the phase relationship by the use of a coil and two indicating lamps, each being connected in a respective branch of a Y-connected power source so that an indication is given by the illumination of one lamp and concurrent darkness of the other lamp. However, the operating ranges of the lamps are wide and the insertion of the coil causes a phase delay of that particular branch. Accordingly, when the phase switching relay is automatically operated there may be an accidental malfunction and burn-out of the relay, so that its use is limited. Also, in case the resistance and condenser and relay are respectively connected in a Y-connection and connected with a three phase power source, a non-operative low voltage is supplied with the relay same as the lamp. Accordingly it cannot be operated for a long time and their use is limited.

Finally, there is a means for detecting the phase relationship by the use of a number of transformers but this system is expensive, bulky and heavy.

One object of the present invention is to provide an electrical circuit for detecting whether a three phase alternating current power supply is either positive or of the opposite phase which is compact in construction.

Another object is to provide a phase detecting circuit which includes the use of a voltage advancing means such as a condenser in one leg of a Y connected three phase circuit and a voltage delaying means such as a coil in another leg to control a phase sequence detector which actuates a phase switching circuit controlled by the conductivity, or non-conductivity of an element which is responsive to a photo-cell.

The circuit of this invention relies in the fact that if a voltage delaying device is inserted in one leg of a balanced three phase supply and a voltage advancing device is inserted in another leg, the outputs of these legs can be combined, through a rectifying means, with the output of the third leg of the supply to provide a single phase output which develops one voltage when the load is connected to the main supply in one way and another voltage when the legs of the load circuit are connected in the opposite way. The control device includes switching relay means which is responsive to these two voltages to assure that if the connections have been made correctly, no switching will take place, but if the connection is incorrect, two of the connections will automatically be reversed. The delaying means preferably comprises an inductance, while the advancing means may comprise a capacitor, the third leg including a resistor connected in series with a full-wave rectifier.

A voltage-responsive device, such as a neon lamp is connected in the output of the rectifier so that one of the voltages produced as a result of the combining of the leading and lagging voltages is too low to energize the lamp, the other voltage being sufficiently high so as to ensure its illumination. A photocell, of the cadmium sulfide type is positioned to be illuminated by the neon lamp to energize a switching relay. This relay normally connects two of the three-phase connections to the load in a positive manner, but when energized by the photocell, will reverse these two connections; the third connection being always connected to one terminal of the load.

In modified forms of the invention, the rectifier can be inserted in either the lagging, or leading leg of the three-phase circuit.

Still other forms of the invention include a switching relay to connect two of the three leads to a reversible three-phase motor control in their proper relationship to the supply connections automatically.

Other objects and advantages will be apparent to those skilled in the art after reading the following specification in connection with the annexed drawings, in which.

Figure 1:
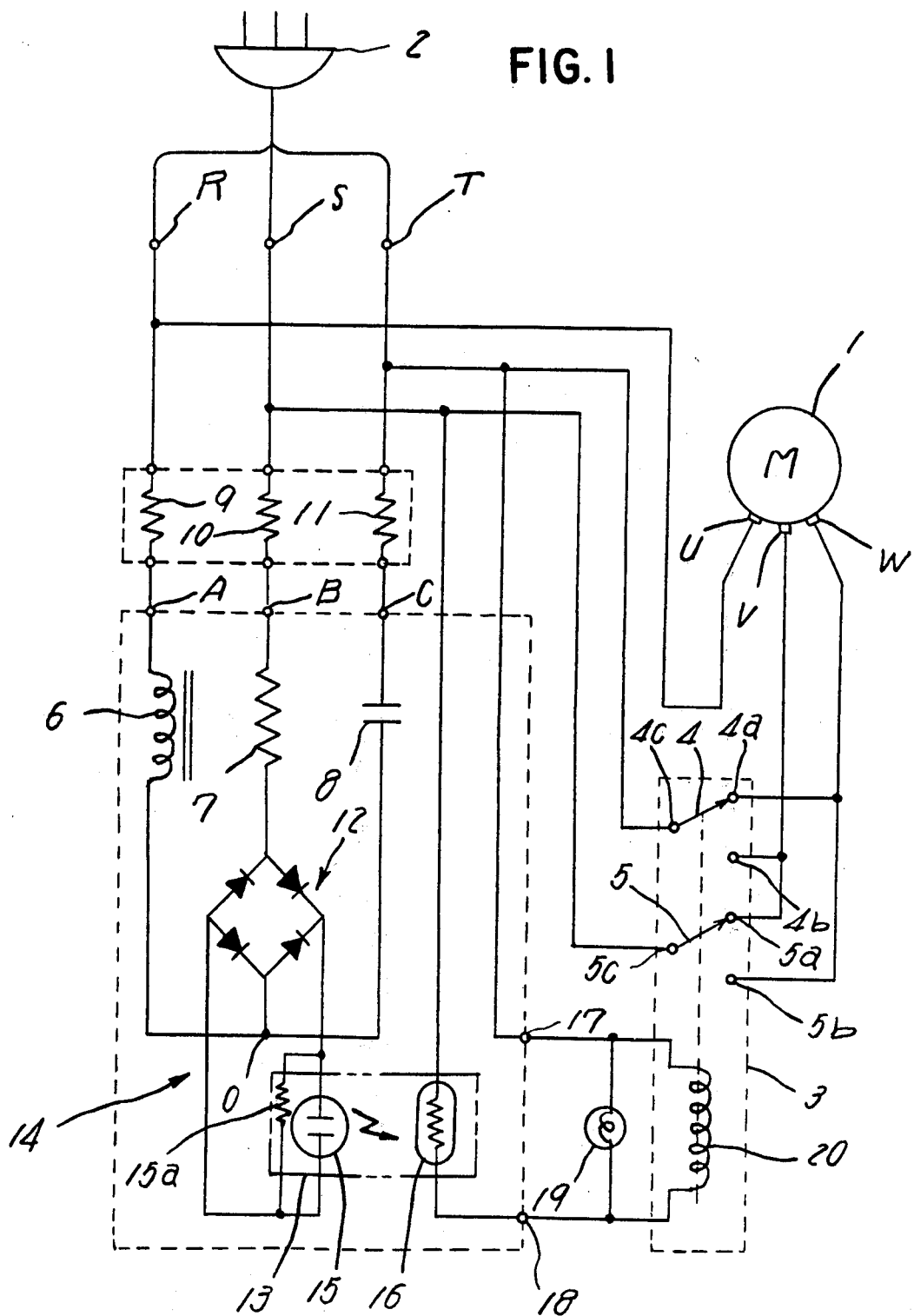
FIG. 1 is a circuit diagram of a preferred form of automatic phase detection and switching system according to the invention.

The embodiment of the invention shown in FIG. 1 comprises a three-phase alternating current load, such as the electric motor 1, having input terminals designated by letters U; V and W for energizing a three-phase field coil. Numeral 2 indicates a plug for connection with a socket (not shown) which supplies three-phase electric power each phase being displaced by 120°. Plug 2 serves as the terminal for leads R; S and T which distribute the power to terminals U; V and W through a relay, designated by the dotted lines 3, having ganged movable contacts 4 and 5 for reversing the connections of leads S and T.

An inductance, such as coil 6, a resistance 7 and capacitor 8 have their respective one ends A; B and C connected to the respective power leads R; S and T through respective resistors 9; 10 and 11 to supply a common working voltage, such as 200 volts to the control system. The other ends of coil 6 and capacitor 8 are connected together at a neutral point O, which is also connected to one input of a full-wave rectifier 12, the other input being connected to the other end of resister 7 so that there is substantially no resistance in the path between resister 7 and neutral point O.

Figure 2:
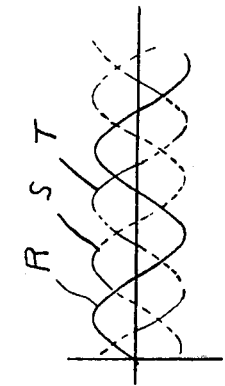
FIG. 2 is a diagram of the electrical relationships in a balanced three-phase power supply.

Under these conditions the impedance of coil 6, the resistance of resister 7 and the capacitance of capacitor 8 are chosen such that when the leads R; S and T are connected to the source in positive phase, as shown in FIG. 2, and the voltage at coil 6 is high, it will also have a low value at resister 7. Correspondingly, if the connections are reversed to the opposite phase, the voltage at coil 6 will be low and the voltage at resister 7 will be high.

The following table shows the voltage and current relationships when leads R; S and T are connected to a 200 volt source and the connections are in either positive, or opposite phase:

| Phase voltage phase current | Positive phase | connection | Opposite phase | connection |
|---|---|---|---|---|
| | Voltage (Volt) | Current (mm/AM) | Voltage (Volt) | Current (mm/Am) |
| Coil (6) | 200 | 2 | 42 | 0.45 |
| Resistor (7) | 21 | 0.35 | 190 | 1.7 |
| Condenser (8) | 195 | 2.2 | 140 | 1.6 |

The rectifier 12 and the elements included within the dotted lines 13 comprise a phase sequence detector as indicated by numeral 14. This detector includes a voltage responsive element, such as a neon gas lamp 15 with its protective resister 15a and a photo-conductive cell 16, which may comprise a cadmium sulfide (Cd S) element. The neon lamp 15, and resistor 15a are connected in parallel to the direct current output of rectifier 12 and the output terminal 17 of the phase detector is connected directly to the lead T. The other output terminal 18 is connected to one side of the photo-conductive cell 16, the other side of which is connected directly to lead S, and the cell 16 is positioned to be responsive to illumination of neon lamp 15 to assume a conductive state and is shielded from other light sources so as to become non-conductive when the voltage across lamp 15 is insufficient to ionize the gas to cause illumination. An indicator device, such as lamp 19 and the actuator coil 20 of switching relay 3 are connected in parallel to terminals 17 and 18.

The normally closed contact 4a of the movable relay contact 4 and the normally open contact 5b of relay contact 5, are connected to terminal W of motor 1. Normally open contact 4b of movable relay contact 4, and the normally closed contact 5a of relay contact 5, are connected to terminal V of the motor, while terminal U is directly connected to the conductor R, leading from plug 2. Conductor S is connected to the fixed contact 5c of movable contact 5, while conductor T is connected to fixed contact 4c of movable contact 4.

There are three possible connections between the conductors R; S and T and the three Y connected wires of a supply circuit (not shown) which will establish a positive phase relationship in the load circuit and phase detection circuit, and also three possible connections which would establish the opposite phase relationship. By analogy, considering the connections A; B and C, leading to inductance 6, resistance 7 and capacitor 8, as a load circuit connected to a supply circuit comprising the leads R; S and T, these positive and opposite phase connections are shown in the following table:

| Input terminals | Positive phase connection | | | Opposite phase connection | | |
|---|---|---|---|---|---|---|
| A | R | S | T | R | T | S |
| B | S | T | R | T | S | R |
| C | T | R | S | S | R | T |

From the above table it thus can be seen that with a three-phase balanced alternating current source, represented, for example by conductors R; S and T, in which each phase is separated by 120°, a positive phase exists when inputs A; B and C are connected respectively to (1) R; S and T, (2) S; T and R, or (3) T; R and S. On the hand, an opposite phase exists when the respective connections are made to (1) R; T and S, (2) T; S and R, or (3) S; R and T.

As a result, if the input terminals are connected in any of the positive phase relationships to conductors R; S and T, the voltage will lag in coil 6 by 90° and will be advanced by 90° by capacitor 8 and the result is to create a single phase which, when supplied to coil 6 results in a relatively high potential, but which drops to a relatively low 21 volts at resister 7. This voltage is insufficient to energize neon lamp 15 and the result is that photocell 16 remains non-conductive. Since the resistance of the cell is thus infinite, there is no electrical flow at output terminals 17 and 18 and the indicator lamp 19 and relay actuator coil 20 are not energized. Under this condition, conductors R; S and T are connected respectively to terminals U; V and W and the motor 1 is driven in positive rotation, as shown in FIG. 1. This condition will prevail so long as the connections to the power source remain unchanged, or if a change is made from an opposite phase to a positive phase connection.

On the other hand if, the inputs A; B and C and conductors R; S and T are connected in one of the opposite phase relationships, such as to sources R; T and S, respectively, the voltage from R will lag by 90° which the voltage from S will be advanced by 90°. This will generate a single phase alternating current in the detector circuit having a low potential of 42 volts at coil 6 and a high potential of 190 volts at resister 7. This voltage supplied through rectifier 12, is sufficient to illuminate neon lamp 15. Illumination from the lamp causes the photo-conductive cell 16 to become conductive, and it will remain conductive as long as the opposite phase connections are maintained. The conductivity of cell 16 closes the circuit to terminals 17 and 18 and both the indicator lamp 19 and relay coil 20 are energized from leads S and T.

Energization of coil 20 causes the movable contacts 4 and 5 to open their connections with contacts 4a and 5a and to close a connection with contacts 4b and 5b, which reestablishes the positive phase relationship between the supply and the motor. Similarly, if the connections of R and T, or R and S, are reversed when connected to a source, the same situation will result, namely; the two reversed connections will be automatically reversed by the relay switch 3 to restore the positive phase relationship to the motor 1, and the indicator lamp 19 will remain lit to indicate that an opposite phase connection of R; S and T has been made with the three-phase source.

Figure 3:
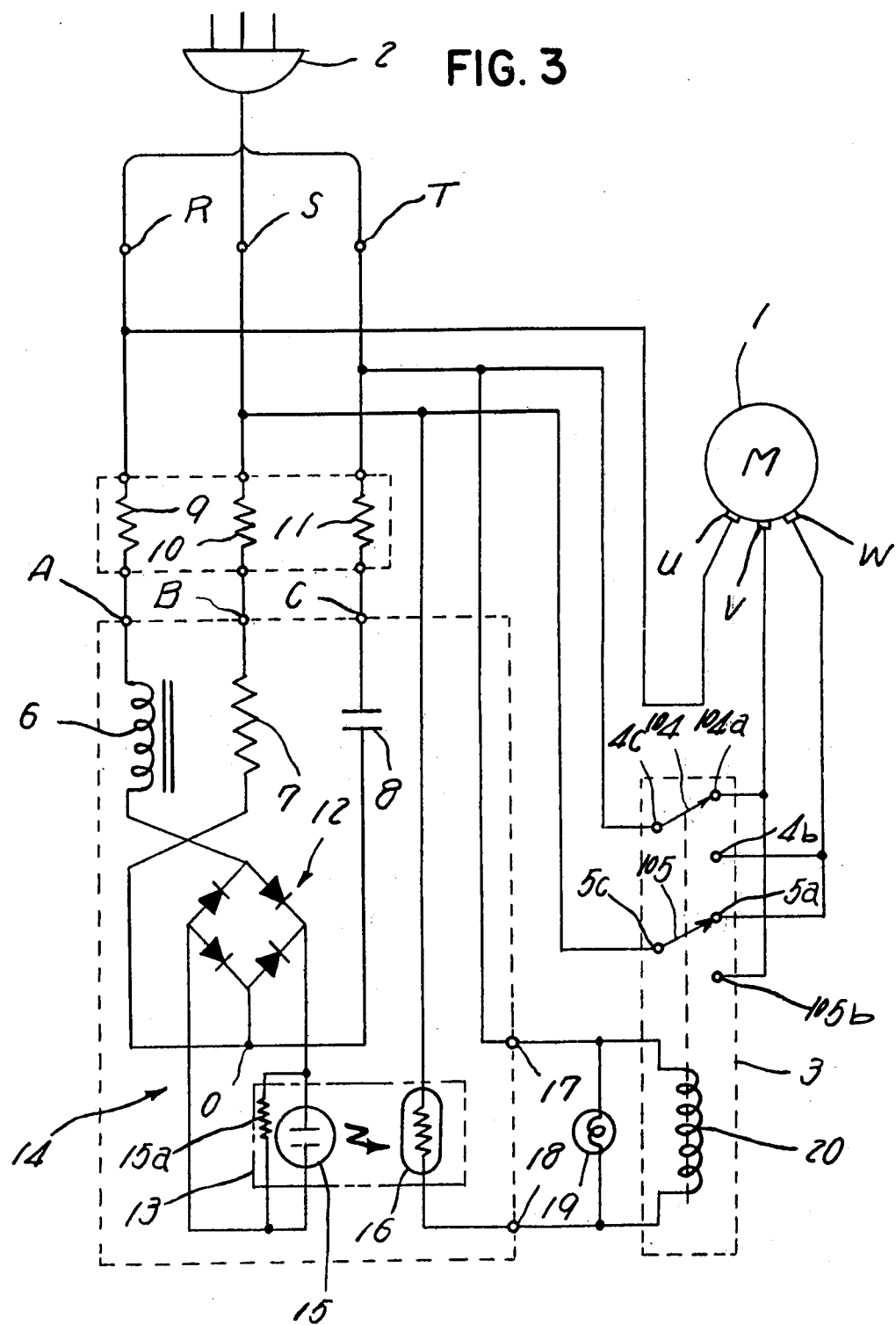
FIG. 3 is a modification of the circuit of FIG. 1.

In FIG. 3, another embodiment of the invention is shown, in which the rectifier 12 is inserted between coil 6 and neutral point O, rather than in series with resister 7. Also in this case, while conductor R is still connected to terminal U or motor 1, the normally closed contact 104 and 104a and the normally open contact 105b of movable contact 105 are connected to terminal V, while normally open contact 4b and normally closed contact 5a are connected to terminal W.

In this case, when the conductor R; S and T are connected with a source in positive phase, a single phase current is generated as in the previous modification. However, the high potential of 200 volts at coil 6 is fed, through rectifier 12, to neon lamp 15 so that it becomes illuminated and causes cell 16 to become conductive. The result is that indicator lamp 19 and relay coil 20 become energized to shift contacts 104 and 105 to reestablish connection between conductors R; S and T and terminals U; V and W of the motor 1, causing it to rotate positively.

On the other hand, when the conductors R; S and T are connected in opposite phase relationship, the single-phase current generates a potential of only 42 volts at coil 6 and when supplied through rectifier 12 is insufficient to light lamp 15 and cell 16 becomes non-conductive. The result is that no current is supplied to output terminals 17 and 18, the lamp 19 is not illuminated and relay coil 20 is deenergized to return the connections of movable contacts 104 and 105 to the condition as shown in FIG. 3 to continue driving the motor in positive rotation.

Therefore, as can be seen, the motor will always be driven with positive rotation by the circuits of FIGS. 1 and 3 regardless of the connections made between conductors R; S and T and a three-phase source.

Figure 4:
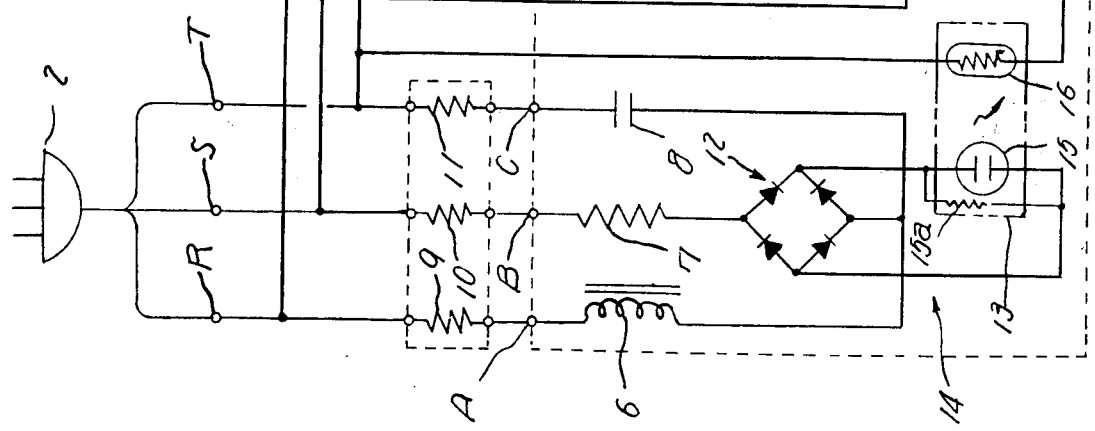
FIG. 4 is another modification for use with a reversible three-phase motor.

A further modification is shown in FIG. 4 wherein the phase detecting circuit of FIG. 1 is used in the operation of a reversible electric motor, indicated by numeral 1, such as would be used to operate a pump or a chain block. In this modification a first relay 21 and a second relay 22 are used to connect leads R; S and T to motors terminals U; V and W alternatively to run the motor in either forward or reverse direction. The movable contacts 21a; 21b and 21c, are arranged to connect leads R; S and T to terminals U; V and W in positive phase when coil 21d of relay 21 is energized and the movable contacts 22a; 22b and 22c will connect the leads to the motor in opposite phase relationship when coil 22d of relay 22 is energized. The relay coils 21d and 22d is connected in series and the open end of coil 21d is connected to the normally closed contact 4a and the normally open contact 5b of a relay 3 which is similar to that shown in FIG. 1. Relay coil 22d has its open end connected to the normally open contact 4b and normally closed contact 5d.

A power supply having output terminals X and Y is used to alternatively energize coils 21d and 22d. Terminal X is connected to one side of a positive rotation motor switch 23 and one side of an opposite rotation motor switch 24, while the other side of switch 23 is connected to fixed contact 4c of moving contact 4 and the other side of switch 24 is connected to fixed contact 5c of moving contact 5. Terminal Y is connected to the common connection between coils 21d and 22d.

As is the case with the circuit of FIG. 1, when the conductors R; S and T are connected in positive phase the relay 3 is not energized and the connections are as shown in FIG. 4. Thus, when the positive rotation switch 23 is closed, coil 21d is energized from power supply terminals X and Y, movable contact 4 and fixed contact 4a to close contacts 21a; 21b and 21c; this establishes connections between conductors R; S and T and motor terminals U; V and W for forward rotation. Alternatively, if opposite rotation switch 24 is closed (switch 23 being open) coil 22d is energized from supply terminals X and Y, moving contact 5 and fixed contact 5a. This energizes coil 22d to close contacts 22a; 22b and 22c to connect conductors R; S and T respectively with terminals W; V and U of the motor to produce reverse rotation.

If the conductors R; S and T should be connected to a three-phase source in such a way as to produce the opposite phase relationships, the photo-conductive cell 16 will become conductive, as explained in connection with FIG. 1, indicator lamp 19 and coil 20 of relay 3 will become energized to change the positions of contacts 4 and 5. Thereafter, actuation of switch 23 will energize coil 22d and, because of the opposite phase of the power supplied by conductors R; S and T, the motor will still operate in the forward direction. Similarly, actuation of switch 24 will energize coil 21d to produce reverse rotation of the motor because of the reversed phase relationships of the supply from R; S and T. Therefore, regardless of the phase relationships between the supply and the internal circuitry, operation of switch 23 will always produce forward rotation of motor 1, and reverse rotation will always result from operation of switch 24.

Figure 5:
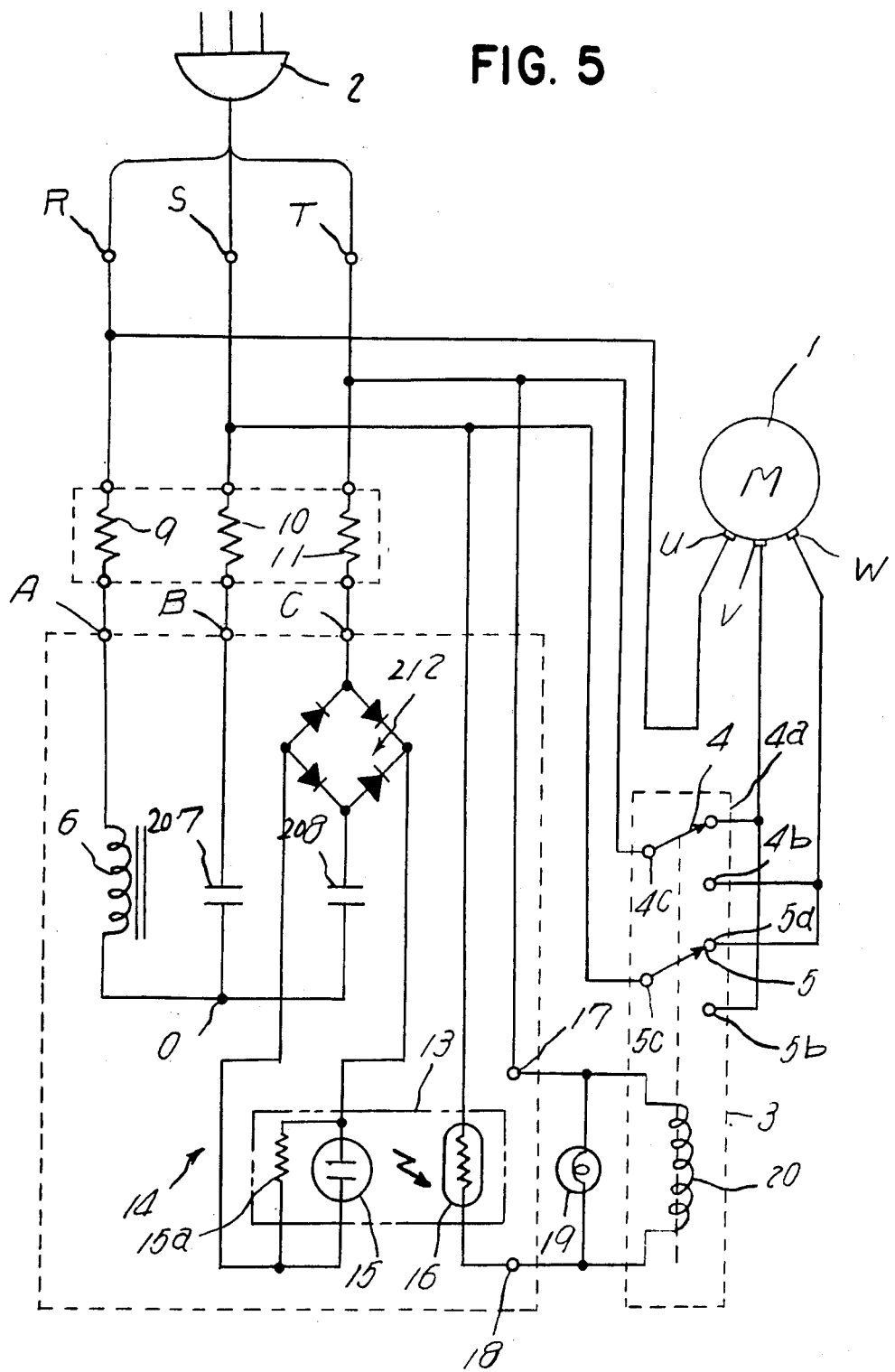
FIGS. 5 and 6 are modifications of the circuit of FIG. 1.

In the embodiment of FIG. 5, the relay 3 is energized when the phase relationships are positive and is deenergized when the phase relationships are opposite, in contradistinction to the previously described forms of the invention. For this purpose, a capacitor 207 is substituted for the resister in the leg leading from input B and capacitor 208 and full wave rectifier 212 are connected in series in the leg connected between input C and neutral point O, whereby the rectifier 212, and elements 15 and 16 comprise the phase detector 14. In addition, moving contact 4 of relay normally connects lead T with terminal V of the motor through fixed contact 4a and moving contact 5 normally connects lead S with terminal W through fixed contact 5a. Normally open contacts 4b and 5b are connected to terminals W and V respectively.

As described above, when the conductors R; S and T are connected in positive phase with a three-phase power supply, the voltage in the leg containing coil 6 is delayed by 90° while the voltages in the other two legs are advanced by 90° by capacitors 207 and 208, and a single phase alternating current flows through the input of rectifier 212. The resultant potential at capacitor 208 is relatively high (200 volts) and is relatively low at capacitor 207 (5 volts), and the high voltage fed from the output of the rectifier is sufficient to illuminate neon lamp 15. As in the previous modifications this results in energization of indicator lamp 19 and relay coil 20. Accordingly lead S is connected to terminal V of the motor through contacts 5 and 5b and lead T is connected to terminal W through contacts 4 and 4b, to drive the motor in positive (forward) direction. This situation will occur with any arrangement of the conductors R; S and T when connected in positive phase relationship to a three-phase source.

Further, when the conductors R; S and T are connected to a three-phase in opposite phase relationship the voltage at capacitor 207 will be at a peak (200 Volts) while the voltage at capacitor 208 will only be 5 volts which, when fed through the rectifier 212, will be insufficient to light the neon lamp 15. Since no illumination reaches cell 16 its resistance value increases to substantially infinity and lamp 19 and coil 20 are no longer energized and the relay contacts 4 and 5 will return to, or remain in their positions as shown in FIG. 5. That is to say, the opposite phase power source will be fed to the motor 1 in positive phase relationship to operate the motor in forward direction.

In the following table the values of voltage and resistance at capacitors 207 and 208 and across output terminals 17 and 18 is given for both positive and opposite phase connections where the input is 200 volts.

|  | Positive phase connection | Opposite phase connection |
| --- | --- | --- |
| Phase voltage of the coil (6) | 200 Volts | 200 Volts |
| Phase voltage of the first | 5 Volts | 200 Volts |

-continued

|  | Positive phase connection | Opposite phase connection |
|---|---|---|
| condenser (207) | | |
| Phase voltage of the second condenser (108) | 200 Volts | 5 Volts |
| The resistor between the output teminals (17) (18) | 210 Ohm's | 21 Megohms |

Figure 6:
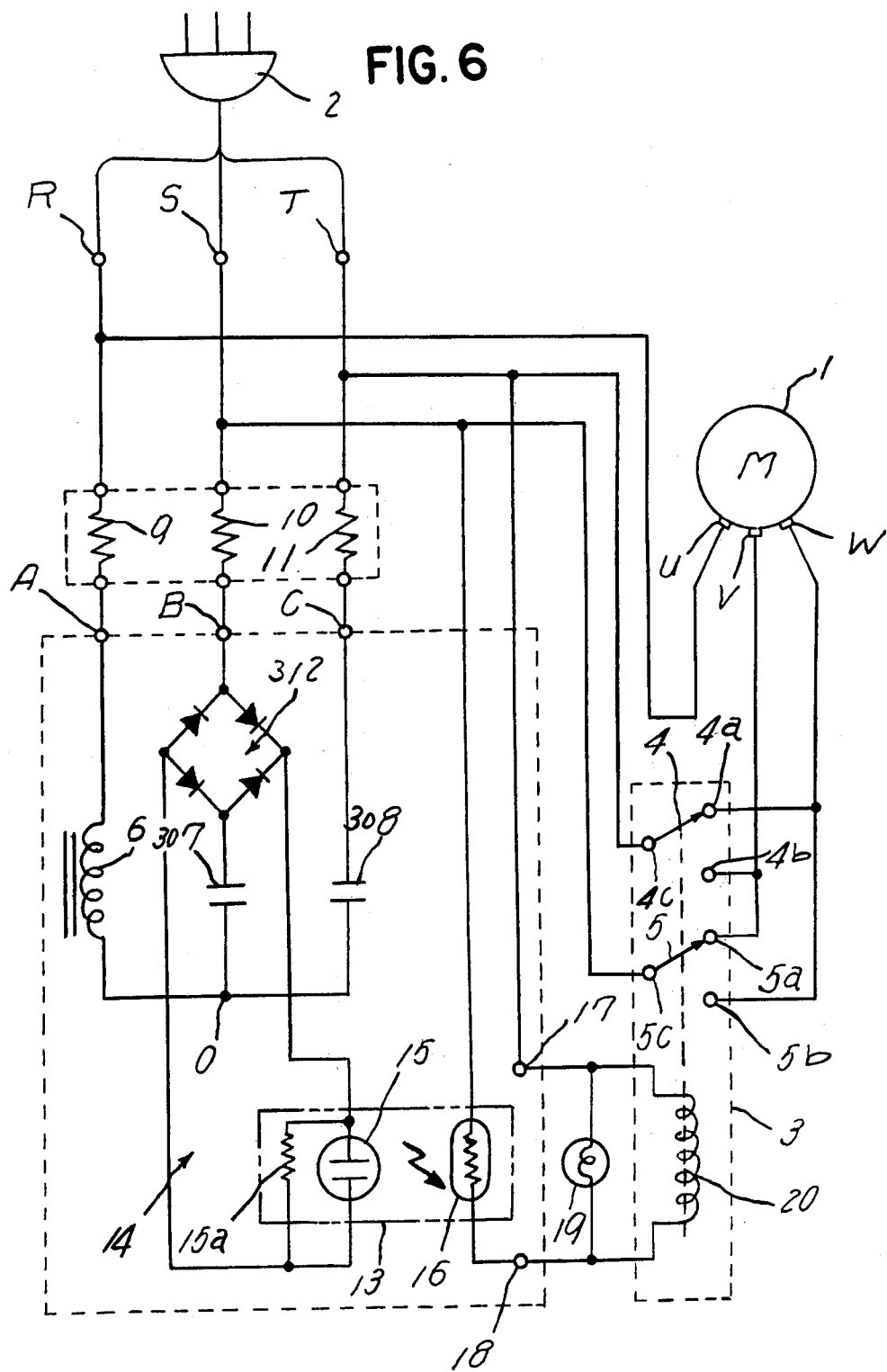

The embodiment of FIG. 6 is similar to that of FIG. 5 in that an inductance and two capacitors are used to generate the single-phase signal for the phase detector circuit. It differs however by virtue of the fact that the motor is driven in forward direction when conductors R; S and T are connected in proper phase relationship, as in the modifications of FIGS. 1-4.

In FIG. 6, inductance coil 6 is connected in the branch connected to lead R, as in the previous forms, capacitor 307 is connected in the branch of lead S and capacitor 308 is connected in the branch of lead T. Full wave rectifier 312 is connected in branch S in series with capacitor 307 and the output of the rectifier is connected to the input of detector system 13. Movable contact 4 of the relay 3 is normally connected to contact 4a and movable contact 5 is normally connected to contact 5a. Motor terminal U is connected to lead R; terminal V is connected to normally open contact 4b and normally closed contact 5a, and terminal W is connected to normally closed contact 4a and normally open contact 5b. Thus, when the conductors R; S and T are connected in proper (positive) phase relationship to a three-phase power source the voltage developed at capacitor 207 is 5 volts, whereas at capacitor 208 it will be 200 volts. Accordingly, neon lamp 15 is not lit, photo-conductive cell 16 remains non-conductive, indicator lamp 19 and coil 20 are not energized, and the relay 3 remains as shown in FIG. 6. The motor is driven in forward rotation because conductor R; S and T are connected, respectively, to terminals U; V and W.

When the conductors R; S and T are connected in opposite phase, the potential at capacitor 307 is 200 volts and at capacitor 308 is reduced. Under this condition, the neon lamp 15 is illuminated and, as previously explained, the relay 3 will shift to its energized position, and the connections between leads R; S and T and the motor will be shifted to maintain, or establish forward rotation. As in the circuits shown in FIGS. 1 and 3, the motor will always be driven in forward rotation without regard to the connections established by the input conductors.

Figure 7:
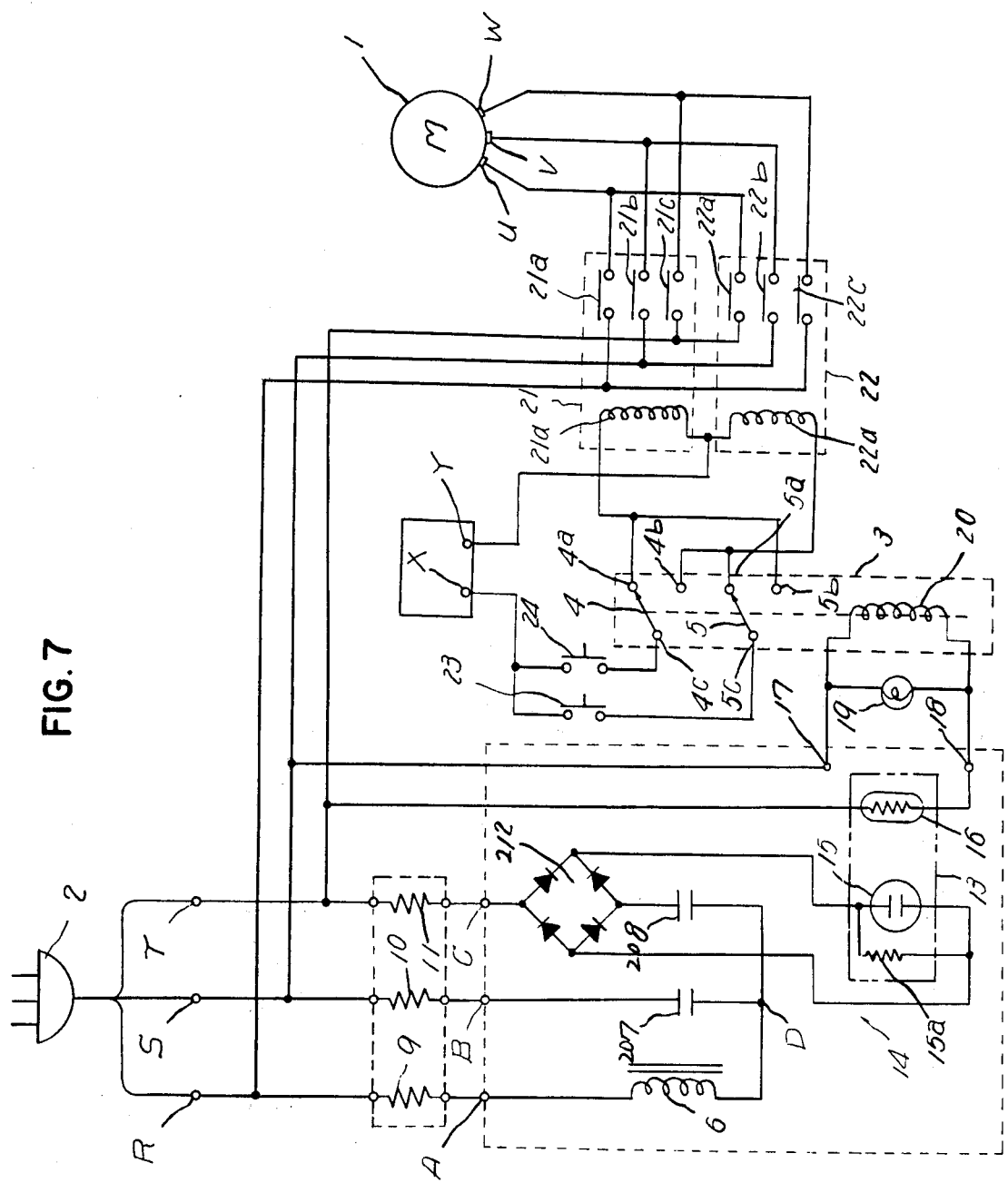
FIG. 7 is a modification of the circuit of FIG. 4.

Another modified circuit detecting system for operating a reversible three-phase motor is shown in FIG. 7. As shown in the circuit of FIG. 5, capacitor 207 and 208 are inserted in the branches connected with input terminals B and C, and rectifier 212 is connected in series with capacitor 208. Under these conditions when the conductors are connected to a three-phase source in opposite relationship the indicator lamp 19 and switching relay 3 are not energized. For this reason the relay 3, while similar to the relay 3 of FIG. 4, is connected so that the switches 23 and 24 for forward and reverse drive of the motor, are transposed. Thus when the conductors R; S and T are connected in opposite phase relationship, movable contacts 4 and 5 will be connected to fixed contacts 4a and 5a, respectively, as shown in FIG. 7, so that actuation of forward switch 23 will energize coil 22d to close contacts 22a; 22b and 22c, and actuation of reverse switch 24 will energize coil 21d to close contacts 21a; 21b and 21c. When the conductors R; S and T are connected in positive relationship, the neon lamp 15 and relay coil 20 are energized and the positions of movable contact 4 and 5 are reversed so that forward switch 23 will energize coil 21d and reverse switch 24 will energize coil 22d to maintain the proper motor direction.

While there are shown several examples in which a single inductance and a pair of capacitors are used to delay and advance the individual phase voltages it will be understood that a similar effect could also be produced by the use of inductances in two branches of a three-phase detector circuit with a capacitor in the third branch.

What we claimed is:

1. In a phase detector circuit for use in the connection of a three-phase load to a three-phase power supply comprising;
   first circuit means to produce a single-phase output signal when connected to said three-phase supply with said three-phase load;
   said output single having a first electrical characteristic when the load is connected to the supply in positive phase relationship and having a second electrical characteristic when the load is connected in opposite phase relationship;
   second circuit means including control element means and output signal detecting means responsive to one said first and second electrical characteristics to establish a conductive circuit condition for said control element means and responsive to the other of said characteristics to establish a non-conductive circuit condition for said control element means;
   the control element means being responsive to said conductive circuit condition to connect the load to the supply in one of two alternative phase relationships and being responsive to said non-conductive circuit condition to connect the load to the supply in the other of the alternative phase relationships;
   said first circuit means comprising three branches connected with respective branches of the three-phase supply, one of said branches including inductance means to delay the phase, another of the branches including capacitor means to advance the phase, said three branches being connected together beyond said respective inductance and capacitor means, and rectifier means having an input series-connected in one of said three branches, the output of the rectifier means being connected with the second circuit means;
   said output signal detecting means comprises photovoltaic transducer means responsive to one of said first and second electrical characteristics to assume a conductive state and responsive to the other characteristic to assume an infinitely resistive state, and said control element means includes relay coil means connected to said power supply through said transducer means to be energized when the transducer means is conductive;
   said second circuit means including a source of illumination coupled with the transducer means and connected with said output signal to become illuminated in response to only one of the first and second electrical characteristics of said signal.

2. The phase detector of claim 1, wherein said first and second electrical characteristics are voltages of respectively different values.

3. The phase detector of claim 1, wherein the input of the rectifier means is connected in said one branch in series with said inductance means.

4. The phase detector of claim 1, wherein the input of the rectifier means is connected in said another branch in series with said capacitor means.

5. The phase detector of claim 1, wherein the input of the rectifier means is connected in the remaining branch of said first circuit means.

6. The phase detector of claim 1, wherein said remaining branch includes resister means in series with said input.

7. The phase detector of claim 1, wherein said remaining branch includes capacitor means in series with said input.

8. The phase detector of claim 1, wherein said control element means includes reversing switch means for alternatively reversing the connections between two branches of the power supply and two branches of the input of said load.

9. The phase detector of claim 8, wherein said load includes a reversible three-phase motor and switching means connected with said input to control the rotation of the motor.

10. The phase detector of claim 1, wherein said source of illumination is a neon lamp and one of said first and second electrical characteristics is a voltage insufficient to energize said lamp, the other characteristic being a voltage sufficient to energize the lamp.

11. The phase detector of claim 1, wherein said first circuit means comprises three input branches to be connected with the load to a three-phase power supply, the outputs of the three branches being joined in a common Y connection, and means to delay the phase in one branch between the input and output, said single phase output signal being a voltage generated between the input and output of one of said three branches as a result of said delay and advance of phases.

* * * * *